United States Patent
Ellison

(10) Patent No.: US 9,932,262 B2
(45) Date of Patent: *Apr. 3, 2018

(54) DIMENSIONALLY-STABLE, DAMAGE-RESISTANT, GLASS SHEETS

(71) Applicant: CORNING INCORPORATED, Corning, NY (US)

(72) Inventor: Adam James Ellison, Corning, NY (US)

(73) Assignee: Corning Incorporated, Corning, NY (US)

( * ) Notice: Subject to any disclaimer, the term of this patent is extended or adjusted under 35 U.S.C. 154(b) by 29 days.

This patent is subject to a terminal disclaimer.

(21) Appl. No.: 14/862,496

(22) Filed: Sep. 23, 2015

(65) Prior Publication Data

US 2016/0009590 A1    Jan. 14, 2016

Related U.S. Application Data

(63) Continuation of application No. 14/204,456, filed on Mar. 11, 2014, now Pat. No. 9,150,448.

(60) Provisional application No. 61/781,604, filed on Mar. 14, 2013.

(51) Int. Cl.
   *C03C 3/093*  (2006.01)
   *C03C 3/091*  (2006.01)
   *C03B 18/02*  (2006.01)
   *H01L 27/12*  (2006.01)

(52) U.S. Cl.
   CPC ............. *C03C 3/093* (2013.01); *C03B 18/02* (2013.01); *C03C 3/091* (2013.01); *H01L 27/1214* (2013.01)

(58) Field of Classification Search
   CPC ................................. C03C 3/093; C03C 3/091
   See application file for complete search history.

(56) References Cited

U.S. PATENT DOCUMENTS

| | | |
|---|---|---|
| 5,801,109 A | 9/1998 | Nishizawa et al. |
| 5,851,939 A | 12/1998 | Miwa |
| 6,060,168 A | 5/2000 | Kohli |
| 6,169,047 B1 | 1/2001 | Nishizawa et al. |
| 6,329,310 B1 | 12/2001 | Peuchert et al. |
| 6,537,937 B1 | 3/2003 | Nishizawa et al. |
| 8,975,198 B2 | 3/2015 | Allan et al. |
| 9,150,448 B2 * | 10/2015 | Ellison .................... C03C 3/093 |
| 2002/0013210 A1 | 1/2002 | Peuchert et al. |
| 2006/0003884 A1 | 1/2006 | Nishizawa et al. |
| 2007/0191207 A1 | 8/2007 | Danielson et al. |
| 2009/0103040 A1 | 4/2009 | Shimizu et al. |
| 2009/0294773 A1 | 12/2009 | Ellison |
| 2010/0088648 A1 | 4/2010 | Martin et al. |
| 2012/0088648 A1 * | 4/2012 | Ellison .................... C03C 3/093 501/59 |
| 2012/0135852 A1 | 5/2012 | Ellison et al. |
| 2014/0179510 A1 | 6/2014 | Allan et al. |
| 2015/0093561 A1 | 4/2015 | Tokunaga et al. |

FOREIGN PATENT DOCUMENTS

| | | |
|---|---|---|
| EP | 1475355 A1 | 11/2004 |
| JP | 09-156953 | 6/1997 |
| WO | 2011132785 A1 | 10/2011 |

OTHER PUBLICATIONS

P.H. Kobrin, et al., "The Effects of Thin Compressive Films on Indentation Fracture Toughness Measurements", Journal of Materials Science, 1989, vol. 24, pp. 1363-1367
R. Tandon, et al., "Surface Stress Effects on Indentation Fracture Sequences", Journal of the American Ceramic Society, 1990, vol. 73, No. 9, pp. 2619-2627.
R. Tandon, et al., "Indentation Behavior of Ion-Exchanged Glasses", Journal of the American Ceramic Society, 1990, vol. 73, No. 4, pp. 970-977.
International Search Report and Written Opinion. dated Oct. 9, 2014, International Application No. PCT/US2014/025510, International Filing Date Mar. 13, 2014.

* cited by examiner

*Primary Examiner* — Elizabeth A. Bolden
(74) *Attorney, Agent, or Firm* — Ryan T. Hardee

(57) ABSTRACT

Described herein are aluminoborosilicate glass compositions that are substantially alkali-free and exhibit desirable physical and chemical properties for use as substrates in flat panel display devices, such as, active matrix liquid crystal displays (AMLCDs). The glass compositions can be formed into glass sheets by, for example, the float process. When used as substrates, the glass sheets exhibit dimensional stability during processing and damage resistance during cutting.

19 Claims, 1 Drawing Sheet

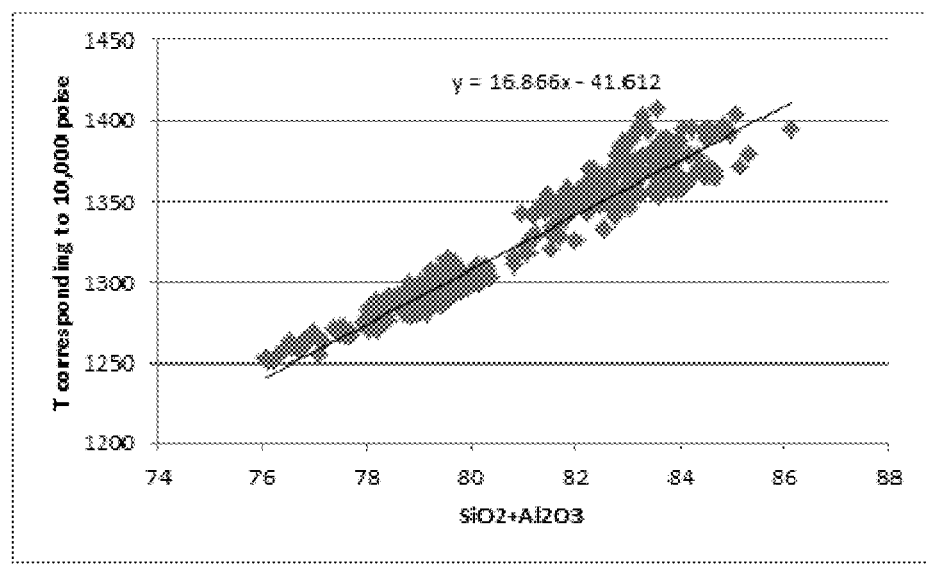

DIMENSIONALLY-STABLE, DAMAGE-RESISTANT, GLASS SHEETS

CROSS-REFERENCE TO RELATED APPLICATIONS

This application is a continuation application of and claims the benefit of priority of U.S. patent application Ser. No. 14/204,456 filed on Mar. 11, 2014 which claims the benefit of priority under 35 U.S.C. § 119 of U.S. Application Ser. No. 61/781,604 filed on Mar. 14, 2013, the entire content of which is hereby incorporated by reference.

FIELD

This disclosure is directed to compositions and methods for making glass sheets capable of use in high performance video and information displays.

BACKGROUND

The production of liquid crystal displays such as, for example, active matrix liquid crystal display devices (AMLCDs) is very complex, and the properties of the substrate glass are extremely important. First and foremost, the glass substrates used in the production of AMLCD devices need to have their physical dimensions tightly controlled.

In the liquid crystal display field, thin film transistors (TFTs) based on poly-crystalline silicon are preferred because of their ability to transport electrons more effectively. Poly-crystalline based silicon transistors (p-Si) are characterized as having a higher mobility than those based on amorphous-silicon based transistors (a-Si). This allows the manufacture of smaller and faster transistors, which ultimately produces brighter and faster displays.

One problem with p-Si based transistors is that their manufacture requires higher process temperatures than those employed in the manufacture of a-Si transistors. These temperatures range from 450° C. to 600° C. compared to the 350° C. peak temperatures employed in the manufacture of a-Si transistors. At these temperatures, most AMLCD glass substrates undergo a process known as compaction. Compaction, also referred to as thermal instability or dimensional change, is an irreversible dimensional change (shrinkage) in the glass substrate due to changes in the glass' fictive temperature. "Fictive temperature" is a concept used to indicate the structural state of a glass. Glass that is cooled quickly from a high temperature is said to have a higher fictive temperature because of the "frozen in" higher temperature structure. Glass that is cooled more slowly, or that is annealed by holding for a time near its annealing point, is said to have a lower fictive temperature.

The magnitude of compaction depends both on the process by which a glass is made and the viscoelastic properties of the glass. In the float process for producing sheet products from molten glass, the glass sheet is cooled relatively slowly from the melt and, thus, "freezes in" a comparatively low temperature structure into the glass. The fusion process, by contrast, results in very rapid quenching of the glass sheet from the melt, and freezes in a comparatively high temperature structure. As a result, a glass produced by the float process may undergo less compaction when compared to glass produced by the fusion process, since the driving force for compaction is the difference between the fictive temperature and the process temperature experienced by the glass during compaction.

Specifically, when a glass is held at an elevated temperature, its structure relaxes towards the heat treatment temperature. Because a glass substrate's fictive temperature is almost always above the relevant heat treatment temperatures in thin film transistor (TFT) processes, this structural relaxation causes a decrease in fictive temperature which therefore causes the glass to compact (shrink/densify). Such compaction is undesirable because it creates possible alignment issues during the display manufacturing process which in turn results in resolution problems in the finished display.

There are several approaches to minimize compaction in glass. One is to thermally pre-treat the glass to create a fictive temperature similar to the one the glass will experience during the p-Si TFT manufacture. There are several difficulties with this approach. First, the multiple heating steps employed during the p-Si TFT manufacturing process create slightly different fictive temperatures in the glass that cannot be fully compensated for by a pretreatment. Second, the thermal stability of the glass becomes closely linked to the details of the p-Si TFT manufacturing process which is to be used, which could mean different pretreatments for different end-users. Finally, pretreatment adds to processing costs and complexity.

Another approach is to slow the rate of strain at the process temperature by increasing the viscosity of the glass. This can be accomplished by raising the viscosity of the glass. For example, the annealing point of a glass represents the temperature corresponding to a fixed viscosity for a glass, i.e., $10^{13.2}$ poise, and thus an increase in annealing point equates to an increase in viscosity at fixed temperature. The challenge with this approach, however, is the production of high annealing point glass that is cost effective. Higher anneal point glasses typically employ higher operational temperatures during their manufacture thereby reducing the lifetime of the fixed assets associated with glass manufacture.

Moreover, a high annealing point is just one of a number of properties that are desirable for a glass composition that is to be used to produce display substrates. Other desirable properties include a high strain point, a low density, and a CTE (coefficient of thermal expansion) compatible with silicon-based electronic components.

A particularly important property is the ability of display manufacturers to cut sheets made from the glass composition into smaller pieces without the generation of large amounts of glass chips and/or the creation of excessive cracking, e.g., lateral cracking, at the cut lines, i.e., without substantial damage to the glass sheets as a result of the cutting. During the etching that takes place during TFT production, defects at the edges of a glass substrate, such as lateral cracks, tend to increase in size. As a consequence, electronic components, such as display drivers, need to be moved inboard from the edges of the substrate, thus increasing the size of the bezel needed to hide those components in a finished display. Such large bezels are incompatible with modern display design which favors small bezels. For ease of reference, the word "cutable" will be used herein to describe (1) glass sheets that can be cut into smaller pieces without the generation of excessive amounts of glass chips and/or lateral cracks, and (2) the glass compositions from which such glass sheets are produced.

SUMMARY

Disclosed herein are glasses that are substantially alkali-free and methods for making the same wherein the glasses are cutable and possess high annealing points and, thus, good dimensional stability (i.e., low compaction). In various embodiments, the glasses also have high strain points, low densities, CTE's compatible with silicon-based electronic components, and $10^4$ poise temperatures less than 1300° C., which make them particularly well-suited for use in making glass sheets in accordance with the float process. Among other applications, the glasses can be used to make glass substrates used to produce high performance video and information displays.

In accordance with a first aspect, a substantially alkali-free glass is disclosed which comprises in mole percent on an oxide basis:
  $SiO_2$: 65-70.3
  $Al_2O_3$: 11-14
  $B_2O_3$: 2-7.5
  MgO: 2-7.5
  CaO: 3-11
  SrO: 0-5.5
  BaO: 0-2
  ZnO: 0-2
wherein:

$$[SiO_2]+[Al_2O_3] \leq 81.3; \text{ and} \qquad (a)$$

$$\Sigma[RO]/[Al_2O_3] \leq 1.3; \qquad (b)$$

where $[SiO_2]$ and $[Al_2O_3]$ are the mole percents of $SiO_2$ and $Al_2O_3$, respectively, and $\Sigma[RO]$ equals the sum of the mole percents of MgO, CaO, SrO, BaO, and ZnO.

In accordance with a second aspect, a method is disclosed for producing substantially alkali-free glass sheets by a float process comprising selecting, melting, and fining batch materials so that the glass making up the sheets comprises in mole percent on an oxide basis:
  $SiO_2$: 65-70.3
  $Al_2O_3$: 11-14
  $B_2O_3$: 2-7.5
  MgO: 2-7.5
  CaO: 3-11
  SrO: 0-5.5
  BaO: 0-2
  ZnO: 0-2
wherein:

$$[SiO_2]+[Al_2O_3] \leq 81.3; \text{ and} \qquad (a)$$

$$\Sigma[RO]/[Al_2O_3] \leq 1.3; \qquad (b)$$

where $[SiO_2]$ and $[Al_2O_3]$ are the mole percents of $SiO_2$ and $Al_2O_3$, respectively, and $\Sigma[RO]$ equals the sum of the mole percents of MgO, CaO, SrO, BaO, and ZnO.

In certain aspects, the glasses are in the form of a plate produced by a float process. In other aspects, the glasses are formed into sheets which serve as substrates for flat panel display devices. In still further aspects, the substrates carry polycrystalline silicon thin film transistors.

The above summaries of the aspects of the invention are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as exemplified by the description herein. The accompanying drawing is included to provide a further understanding of the invention, and is incorporated in and constitutes a part of this specification. It is to be understood that the various features of the invention disclosed in this specification and in the drawing can be used in any and all combinations. In particular, the various claims set forth below and, in particular, the various dependent claims, can be used in any and all combinations.

BRIEF DESCRIPTION OF THE DRAWING

FIG. 1 is a graph of $10^4$ poise temperature (vertical axis) versus the sum of mole percents of $SiO_2$ and $Al_2O_3$ (horizontal axis) for the glass whose $10^4$ poise temperature is being plotted. The straight line in this FIGURE is a linear fit to the data and is given by y=16.866x−41.612, where y is the $10^4$ poise temperature and x is the sum of the mole percents of $SiO_2$ and $Al_2O_3$.

DETAILED DESCRIPTION

Historically, panel makers have generally made either "large, low resolution" or "small, high resolution" displays. In both of these cases, glasses were held at elevated temperatures, causing the glass substrates to undergo compaction.

The amount of compaction exhibited by a glass substrate experiencing a given time/temperature profile can be described by the equation $$T_f(t) - T = (T_f(t=0) - T) \exp\left[-\left(\frac{t}{\tau(T)}\right)^b\right]$$

where $T_f(t)$ is the fictive temperature of the glass as a function of time, T is the heat treatment temperature, $T_f(t=0)$ is the initial fictive temperature, b is a "stretching exponent", and $\tau(T)$ is the relaxation time of the glass at the heat treatment temperature. While increasing the heat treatment temperature (T) lowers the "driving force" for compaction (i.e. making "$T_f(t=0)-T$" a smaller quantity), it causes a much larger decrease in the relaxation time $\tau$ of the substrate. Relaxation time varies exponentially with temperature, causing an increase in the amount of compaction in a given time when the temperature is raised.

For the manufacturing of large, low-resolution displays using amorphous silicon (a-Si) based TFTs, the processing temperatures are relatively low (roughly 350° C. or less). These low temperatures, coupled with the loose dimensional stability requirements for low resolution displays, allow the use of low annealing point (T(ann)) glasses with higher fictive temperatures. The annealing point is defined as the temperature where the glass's viscosity is equal to $10^{13.2}$ Poise. T(ann) is used as a simple metric to represent the low temperature viscosity of a glass, defined as the effective viscosity of the glass at a given temperature below the glass transition temperature. A higher "low temperature viscosity" causes a longer relaxation time through the Maxwell relationship $$\tau(T) \approx \frac{\eta(T)}{G}$$

where $\eta$ is the viscosity and G is the shear modulus.

Higher performance small, high-resolution displays have generally been made using poly-silicon based (p-Si) TFTs, which employ considerably higher temperatures than a-Si processes. Because of this, either higher annealing point or lower fictive temperature glasses are required to meet the compaction requirements for p-Si based TFTs. Considerable efforts have been made to create higher annealing point glasses compatible with existing manufacturing platforms or to improve the thermal history of lower annealing point glasses to enable use in these processes and both paths have been shown to be adequate for previous generations of high performance displays. Recently, however, the p-Si based displays are now being made on even larger "gen size" sheets (many small displays on a single large sheet of glass). This size increase has forced the glass substrate to have even better high temperature compaction performance.

In order to reach higher mobilities in large displays, panel makers have begun making large, high-resolution displays using oxide thin film transistors (OxTFTs). While OxTFT processes are often run with peak temperatures similar to a-Si based TFTs (and often using the same equipment), the resolution requirements are considerably higher, which means low temperature compaction must be considerably improved relative to that of a-Si substrates.

Described herein are glasses that are substantially free of alkalis that possess high annealing points and, thus, good dimensional stability (i.e., low compaction) for use as TFT backplane substrates in amorphous silicon, oxide, and low-temperature polysilicon TFT processes. These high annealing point glasses reduce panel distortion due to compaction/shrinkage during thermal processing subsequent to manufacturing of the glass.

In one aspect, the substantially alkali-free glasses have annealing points greater than or equal to 740° C. (e.g., greater than or equal to 745° C., or greater than or equal to 755° C., or greater than or equal to 765° C., or greater than or equal to 775° C.). Such high annealing points result in low rates of relaxation—and hence comparatively small amounts of dimensional change—for the inventive glasses thus allowing them to be used as backplane substrates in, for example, a low-temperature polysilicon process. In terms of composition, in an embodiment, these annealing points are achieved when the glass satisfies the following relationship:

$$a_0+a_1*[Al_2O_3]+a_2*[B_2O_3]+a_3*[MgO]+a_4*[CaO]+a_5*[SrO] \geq 740$$

(e.g., ≥745; or ≥755; or ≥765; or ≥775)
where:
  (i) [$Al_2O_3$], [$B_2O_3$], [MgO], [CaO], and [SrO] are the mole percents of $Al_2O_3$, $B_2O_3$, MgO, CaO, and SrO, respectively; and
  (ii) $a_0$=847.516, $a_1$=4.747, $a_2$=−10.144, $a_3$=−5.089, $a_4$=−6.837, and $a_5$=−6.548.

In another aspect, the inventive glasses have strain points greater than or equal to 685° C. (e.g., greater than or equal to 690° C., or greater than or equal to 700° C., or greater than or equal to 710° C., or greater than or equal to 720° C.). Along with the high annealing points, these high strain points contribute to the glass' dimensional stability during use as substrates for display devices. In terms of composition, in an embodiment, these strain points are achieved when the glass satisfies the following relationship:

$$a_0+a_1*[Al_2O_3]+a_2*[B_2O_3]+a_3*[MgO]+a_4*[CaO]+a_5*[SrO] \geq 685$$

(e.g., ≥690; or ≥700; or ≥710; or ≥720)
where:
  (i) [$Al_2O_3$], [$B_2O_3$], [MgO], [CaO], and [SrO] are the mole percents of $Al_2O_3$, $B_2O_3$, MgO, CaO, and SrO, respectively; and
  (ii) $a_0$=774.973, $a_1$=4.886, $a_2$=−9.666, $a_3$=−3.610, $a_4$=−5.840, and $a_5$=−5.713.

The inventive glasses are also resistant to damage during cutting. In accordance with the present disclosure, this property of the glass is quantified in terms of the glass's indentation crack initiation threshold. As discussed in, for example, U.S. Patent Application Publication No. US 2012/0135852, a glass's indentation crack initiation threshold can be measured using a Vickers indenter and is indicative of a glass's ability to thwart formation of medial/radial and lateral cracks that propagate away from the locus of an initial flaw.

Although there is no standard ASTM method for the Vickers indenter test, a useful testing method is described in articles by R. Tandon et al., "Surface Stress Effects on Indentation Fracture Sequences," J. Am. Ceram Soc. 73 [9] 2619-2627 (1990); R. Tandon et al., "Indentation Behavior of Ion-Exchanged Glasses," J. Am. Ceram. Soc. 73 [4] 970-077 (1990); and P. H. Kobrin et al., "The Effects of Thin Compressive Films on Indentation Fracture Toughness Measurements," J. Mater. Sci. 24 [4] 1363-1367 (1989). The relevant portions of these articles, as well as the above-referenced U.S. patent application publication, are hereby incorporated by reference.

For the purposes of the present disclosure, quantitative values for a glass's indentation crack initiation threshold are obtained using the technique described in U.S. Patent Application Publication No. US 2012/0135852. Thus, the test load is applied and removed at 0.2 mm/min, the load is held for 10 seconds, and the indentation crack initiation threshold is defined as the indentation load at which 50% of 10 indents exhibit any number of radial/median cracks emanating from the corners of the indent impression. The testing is performed at room temperature in 50% relative humidity. When measured in this manner, glasses which have indentation crack initiation thresholds greater than or equal to 200 grams force (e.g., greater than or equal to 300 grams force, or greater than or equal to 400 grams force) will be cutable, i.e., the amount of glass chips produced during cutting will be commercially acceptable and the cut edge will be stable and free of high levels of unacceptably long and/or large cracks. In terms of composition, in an embodiment, these indentation crack initiation thresholds are achieved when the glass satisfies the following relationship:

$$a_0+a_1*[Al_2O_3]+a_2*[B_2O_3]+a_3*[MgO]+a_4*[CaO]+a_5*[SrO] \geq 200$$

(e.g., ≥300; or ≥400)
where:
  (i) [$Al_2O_3$], [$B_2O_3$], [MgO], [CaO], and [SrO] are the mole percents of $Al_2O_3$, $B_2O_3$, MgO, CaO, and SrO, respectively; and
  (ii) $a_0$=387.802, $a_1$=33.509, $a_2$=52.734, $a_3$=18.704, $a_4$=−40.918, and $a_5$=−77.347.

In addition to the indentation crack initiation threshold, the glass's Young's modulus also plays a role in the behavior of the glass during cutting. Thus, in an embodiment, the glass has a Young's modulus E which satisfies the relationship:

$$84 \text{ GPa} \geq E \geq 68 \text{ GPa}.$$

In terms of composition, in an embodiment, this Young's modulus range is achieved when the glass satisfies the following relationship:

$$84 \geq a_0+a_1*[Al_2O_3]+a_2*[B_2O_3]+a_3*[MgO]+a_4*[CaO]+a_5*[SrO] \geq 68$$

where:

(i) [$Al_2O_3$], [$B_2O_3$], [MgO], [CaO], and [SrO] are the mole percents of $Al_2O_3$, $B_2O_3$, MgO, CaO, and SrO, respectively; and (ii) $a_0=67.773$, $a_1=0.865$, $a_2=-0.825$, $a_3=0.903$, $a_4=0.356$, and $a_5=0.133$.

Glasses for use in AMLCD applications preferably have CTEs (22-300° C.) in the range of $30\text{-}38\times10^{-7}/°$ C. In terms of composition, in an embodiment, this CTE range is achieved when the glass satisfies the following relationship:

$$38 \geq a_0 + a_1*[Al_2O_3] + a_2*[B_2O_3] + a_3*[MgO] + a_4*[CaO] + a_5*[SrO] \geq 30$$

where:

(i) [$Al_2O_3$], [$B_2O_3$], [MgO], [CaO], and [SrO] are the mole percents of $Al_2O_3$, $B_2O_3$, MgO, CaO, and SrO, respectively; and (ii) $a_0=18.773$, $a_1=-0.365$, $a_2=0.187$, $a_3=0.744$, $a_4=1.500$, and $a_5=1.848$.

In some cases, CTEs (22-300° C.) in the range of $32\text{-}36\times10^{-7}/°$ C. are desirable, in which cases, in an embodiment, the composition of the glass preferably satisfies the relationship:

$$36 \geq a_0 + a_1*[Al_2O_3] + a_2*[B_2O_3] + a_3*[MgO] + a_4*[CaO] + a_5*[SrO] \geq 32$$

where:

(i) [$Al_2O_3$], [$B_2O_3$], [MgO], [CaO], and [SrO] are the mole percents of $Al_2O_3$, $B_2O_3$, MgO, CaO, and SrO, respectively; and (ii) $a_0=18.773$, $a_1=-0.365$, $a_2=0.187$, $a_3=0.744$, $a_4=1.500$, and $a_5=1.848$.

For certain applications, density is important so as to reduce the weight of the final display. For example, it is often desirable for the glass to have a density that is less than or equal to 2.56 grams/cm$^3$. In terms of composition, in an embodiment, such low densities are achieved when the glass satisfies the following relationship:

$$a_0 + a_1*[Al_2O_3] + a_2*[B_2O_3] + a_3*[MgO] + a_4*[CaO] + a_5*[SrO] \leq 2.56$$

where:

(i) [$Al_2O_3$], [$B_2O_3$], [MgO], [CaO], and [SrO] are the mole percents of $Al_2O_3$, $B_2O_3$, MgO, CaO, and SrO, respectively; and (ii) $a_0=2.195$, $a_1=0.009$, $a_2=-0.005$, $a_3=0.011$, $a_4=0.013$, and $a_5=0.027$.

As noted above, the glasses disclosed herein are substantially alkali free. It is to be understood that while low alkali concentrations are generally desirable, in practice it may be difficult or impossible to economically manufacture glasses that are entirely free of alkalis. The alkalis in question arise as contaminants in raw materials, as minor components in refractories, etc., and can be very difficult to eliminate entirely. In the case of AMLCD applications, it is desirable to keep the alkali levels below 0.1 mole percent to avoid having a negative impact on thin film transistor (TFT) performance through diffusion of alkali ions from the glass into the silicon of the TFT. As used herein, a "substantially alkali-free glass" is a glass having a total alkali concentration which is less than or equal to 0.1 mole percent, where the total alkali concentration is the sum of the $Na_2O$, $K_2O$, and $Li_2O$ concentrations. In one aspect, the total alkali concentration is less than or equal to 0.07 mole percent.

In one aspect, the inventive glass includes a chemical fining agent. Such fining agents include, but are not limited to, $SnO_2$, $As_2O_3$, $Sb_2O_3$, F, Cl, and Br. The concentrations of the chemical fining agents are kept at a level of 0.5 mol % or less. Chemical fining agents may also include $CeO_2$, $Fe_2O_3$, and other oxides of transition metals, such as $MnO_2$. These oxides may introduce color to the glass via visible absorptions in their final valence state(s) in the glass, and thus their concentration is preferably kept at a level of 0.2 mol % or less.

On an oxide basis, the glass compositions described herein can have one or more or all of the following compositional characteristics: (i) an $As_2O_3$ concentration of at most 0.05 mole percent; (ii) an $Sb_2O_3$ concentration of at most 0.05 mole percent; (iii) a $SnO_2$ concentration of at most 0.25 mole percent.

$As_2O_3$ is an effective high temperature fining agent for AMLCD glasses, and in some aspects described herein, $As_2O_3$ is used for fining because of its superior fining properties. However, $As_2O_3$ is poisonous and requires special handling during the glass manufacturing process. Also, arsenic is incompatible with the float process. Accordingly, in certain aspects, fining is performed without the use of substantial amounts of $As_2O_3$, i.e., the finished glass has at most 0.05 mole percent $As_2O_3$. In one aspect, no $As_2O_3$ is purposely used in the fining of the glass. In such cases, the finished glass will typically have at most 0.005 mole percent $As_2O_3$ as a result of contaminants present in the batch materials and/or the equipment used to melt the batch materials.

Although not as toxic as $As_2O_3$, $Sb_2O_3$ is also poisonous and requires special handling. Also, like arsenic, antimony is incompatible with the float process. In addition, $Sb_2O_3$ raises the density, raises the CTE, and lowers the annealing point in comparison to glasses that use $As_2O_3$ or $SnO_2$ as a fining agent. Accordingly, in certain aspects, fining is performed without the use of substantial amounts of $Sb_2O_3$, i.e., the finished glass has at most 0.05 mole percent $Sb_2O_3$. In another aspect, no $Sb_2O_3$ is purposely used in the fining of the glass. In such cases, the finished glass will typically have at most 0.005 mole percent $Sb_2O_3$ as a result of contaminants present in the batch materials and/or the equipment used to melt the batch materials.

Compared to $As_2O_3$ and $Sb_2O_3$ fining, tin fining (i.e., $SnO_2$ fining) is less effective, but $SnO_2$ is a ubiquitous material that has no known hazardous properties. Also, for many years, $SnO_2$ has been a component of AMLCD glasses through the use of tin oxide electrodes in the Joule melting of the batch materials for such glasses. The presence of $SnO_2$ in AMLCD glasses has not resulted in any known adverse effects in the use of these glasses in the manufacture of liquid crystal displays. However, high concentrations of $SnO_2$ are not preferred as this can result in the formation of crystalline defects in AMLCD glasses. In one aspect, the concentration of $SnO_2$ in the finished glass is less than or equal to 0.25 mole percent.

Tin fining can be used alone or in combination with other fining techniques if desired. For example, tin fining can be combined with halide fining, e.g., bromine fining. Other possible combinations include, but are not limited to, tin fining plus sulfate, sulfide, cerium oxide, mechanical bubbling, and/or vacuum fining. It is contemplated that these other fining techniques can be used alone. In certain aspects, maintaining the individual alkaline earth concentrations within the ranges discussed above makes the fining process easier to perform and more effective.

The glasses described herein can be manufactured using various techniques known in the art. In one aspect, the glasses are made using the well-known and widely-used float process, descriptions of which can be found in standard texts and in the patent literature. In such a case, the glass preferably has a $10^4$ poise temperature that is less than or equal to 1330° C., more preferably, less than or equal to 1320° C., even more preferably, less than or equal to 1310° C. As illustrated in FIG. 1, the $10^4$ poise temperature has been found to vary substantially linearly with the sum, in mole percent on an oxide basis, of $[SiO_2]+[Al_2O_3]$. As a consequence, to achieve a $10^4$ poise temperature that is less than or equal to 1330° C., the glasses disclosed herein satisfy the relationship:

$[SiO_2]+[Al_2O_3]$≤81.3 mole percent.

In certain embodiments, the glass also satisfies the following relationship:

$a_0+a_1*[Al_2O_3]+a_2*[B_2O_3]+a_3*[MgO]+a_4*[CaO]+a_5*[SrO]$≤1330

(e.g., ≤1320; or ≤1310)
where:
(i) $[Al_2O_3]$, $[B_2O_3]$, $[MgO]$, $[CaO]$, and $[SrO]$ are the mole percents of $Al_2O_3$, $B_2O_3$, MgO, CaO, and SrO, respectively; and
(ii) $a_0$=1710.446, $a_1$=−7.715, $a_2$=−14.847, $a_3$=−17.550, $a_4$=−16.643, and $a_5$=−12.574.

In addition to having a $10^4$ poise temperature ($T_{10k}$) that is less than or equal to 1330° C., the glasses also preferably have a liquidus temperature $T_{liq}$ that is lower than the $10^4$ poise temperature, where the liquidus temperature is the highest temperature at which a crystalline phase would appear if a glass were held at that temperature for an extended period of time. In accordance with an aspect of the present disclosure, a suitable $T_{10k}-T_{liq}$ temperature difference is achieved by having the glass's $\Sigma[RO]/[Al_2O_3]$ ratio satisfy the relationship:

$\Sigma[RO]/[Al_2O_3]$≤1.3, where, as defined above, $\Sigma[RO]$ equals the sum of the mole percents of MgO, CaO, SrO, BaO, and ZnO. As discussed below, in certain embodiments, the $\Sigma[RO]/[Al_2O_3]$ ratio is preferably greater than or equal to 1.0 in order to improve fining of the glass.

While the inventive glasses are compatible with the float process, they may also be manufactured into sheets or other ware through other manufacturing processes. Such processes include the fusion, slot draw, rolling, and other sheet-forming processes known to those skilled in the art. As a result of their composition, the disclosed glasses can have relatively low melting temperatures, e.g., 200 poise temperatures less than or equal to 1630° C. Importantly, the glasses melt to good quality with very low levels of gaseous inclusions, and with minimal erosion to precious metals, refractories, and, when used, tin oxide electrode materials. For example, in one aspect, a population of 50 sequential glass sheets having the disclosed compositions when produced from melted and fined batch materials have an average gaseous inclusion level of less than 0.10 (preferably, less than 0.05) gaseous inclusions/cubic centimeter, where each sheet in the population has a volume of at least 500 cubic centimeters. In one embodiment, the glasses of the present disclosure exhibit a transmission at 300 nm of greater than 50% for a 0.5 mm thick article. In another embodiment, the glasses exhibit transmission at 300 nm of greater than 60% for a 0.5 mm thick article.

In the glass compositions described herein, $SiO_2$ serves as the basic glass former. In certain aspects, the concentration of $SiO_2$ is greater than or equal to 65 mole percent in order to provide the glass with a density and chemical durability suitable for a flat panel display glass (e.g., an AMLCD glass), and a liquidus temperature, which allows the glass to be formed by, for example, a float process. In terms of an upper limit, the $SiO_2$ concentration is less than or equal to 70.3 mole percent to allow batch materials to be melted using conventional, high volume, melting techniques, e.g., Joule melting in a refractory melter. As the concentration of $SiO_2$ increases, the 200 poise temperature (melting temperature) generally rises. In various applications, the $SiO_2$ concentration is adjusted so that the glass composition has a melting temperature less than or equal to 1,725° C., preferably, less than or equal to 1630° C. In one aspect, the $SiO_2$ concentration is between 65 and 70.3 mole percent.

$Al_2O_3$ is another glass former used to make the glasses described herein. An $Al_2O_3$ concentration greater than or equal to 11 mole percent provides the glass with a low liquidus temperature. The use of at least 11 mole percent $Al_2O_3$ also improves the glass' annealing point and modulus. In order that the $\Sigma[RO]/[Al_2O_3]$ ratio is greater than or equal to 1.0, it is desirable to keep the $Al_2O_3$ concentration below 14 mole percent. In one aspect, the $Al_2O_3$ concentration is between 11 and 14 mole percent.

$B_2O_3$ is both a glass former and a flux that aids melting and lowers the melting temperature. As discussed above with regard to $SiO_2$, glass durability is very important for LCD applications. Durability can be controlled somewhat by elevated concentrations of alkaline earth oxides, and significantly reduced by elevated $B_2O_3$ content. Annealing point decreases as $B_2O_3$ increases, so it is desirable to keep $B_2O_3$ content low relative to its typical concentration in amorphous silicon substrates. Thus in one aspect, the glasses described herein have $B_2O_3$ concentrations that are between 2 and 7.5 mole percent.

The $Al_2O_3$ and $B_2O_3$ concentrations can be selected as a pair to increase annealing point, increase modulus, improve durability, reduce density, and reduce the coefficient of thermal expansion (CTE), while maintaining the melting and forming properties of the glass.

For example, an increase in $B_2O_3$ and a corresponding decrease in $Al_2O_3$ can be helpful in obtaining a lower density and CTE, while an increase in $Al_2O_3$ and a corresponding decrease in $B_2O_3$ can be helpful in increasing annealing point, modulus, and durability, provided that the increase in $Al_2O_3$ does not reduce the $\Sigma[RO]/[Al_2O_3]$ ratio below 1.0. For $\Sigma[RO]/[Al_2O_3]$ ratios below 1.0, it may be difficult or impossible to remove gaseous inclusions from the glass due to late-stage melting of the silica raw material. Thus in one aspect, the glasses described herein satisfy the relationship:

$\Sigma[RO]/[Al_2O_3]$≥1.0.

In addition to the glass formers ($SiO_2$, $Al_2O_3$, and $B_2O_3$), the glasses described herein also include alkaline earth oxides. In one aspect, at least two alkaline earth oxides are part of the glass composition, e.g., MgO, CaO, and, optionally, SrO and/or BaO. The alkaline earth oxides provide the glass with various properties important to melting, fining, forming, and ultimate use. Accordingly, to improve glass performance in these regards, the $\Sigma[RO]/[Al_2O_3]$ ratio is less than or equal to 1.3 and preferably greater than or equal to 1.0. The concentration of the optional component ZnO is included in the definition of $\Sigma[RO]$ which appears in this ratio because in these glasses, ZnO can have similar effects to the alkaline earths.

For certain embodiments of this invention, the alkaline earth oxides may be treated as what is in effect a single compositional component. This is because their impact upon viscoelastic properties, liquidus temperatures and liquidus phase relationships are qualitatively more similar to one another than they are to the glass forming oxides $SiO_2$, $Al_2O_3$ and $B_2O_3$. However, the alkaline earth oxides CaO, SrO and BaO can form feldspar minerals, notably anorthite ($CaAl_2Si_2O_8$) and celsian ($BaAl_2Si_2O_8$) and strontium-bearing solid solutions of same, but MgO does not participate in these crystals to a significant degree. Therefore, when a feldspar crystal is already the liquidus phase, a super-addition of MgO may serve to stabilize the liquid relative to the crystal and thus lower the liquidus temperature. At the same time, the viscosity curve typically becomes steeper, reducing melting temperatures while having little or no impact on low-temperature viscosities. In this sense, the addition of small amounts of MgO benefits melting by reducing melting temperatures, benefits forming by reducing liquidus temperatures, while preserving high annealing point and, thus, low compaction. Accordingly, in one aspect, the MgO concentration is between 2 and 7.5 mole percent.

Calcium oxide present in the glass composition can produce low liquidus temperatures, high annealing points and moduli, and CTE's in the most desired ranges for flat panel applications, specifically, AMLCD applications. It also contributes favorably to chemical durability, and compared to other alkaline earth oxides, it is relatively inexpensive as a batch material. However, at high concentrations, CaO increases the density and CTE. Furthermore, at sufficiently low $SiO_2$ concentrations, CaO may stabilize anorthite, thus increasing liquidus temperature. Accordingly, in one aspect, the CaO concentration is greater than or equal to 3 mole percent. In another aspect, the CaO concentration of the glass composition is between 3 and 11 mole percent.

SrO and BaO can both contribute to low liquidus temperatures and, thus, the glasses described herein will typically contain at least one of these oxides. However, the selection and concentrations of these oxides needs to avoid an increase in CTE and density and a decrease in modulus and annealing point. The relative proportions of SrO and BaO can be balanced so as to obtain a suitable combination of physical properties and liquidus temperature such that the glass can be formed by a float process. In one aspect, the SrO concentration is less than or equal to 5.5 mole percent and the BaO concentration is less than or equal to 2 mole percent. In another aspect, the SrO concentration is greater than the BaO concentration. In a still further aspect, the BaO concentration is less than or equal to 0.1 mole percent.

To summarize the effects/roles of the central components of the glasses of the invention, $SiO_2$ is the basic glass former. $Al_2O_3$ and $B_2O_3$ are also glass formers and can be selected as a pair with, for example, an increase in $B_2O_3$ and a corresponding decrease in $Al_2O_3$ being used to obtain a lower density and CTE, while an increase in $Al_2O_3$ and a corresponding decrease in $B_2O_3$ being used in increasing annealing point, modulus, and durability, provided that the increase in $Al_2O_3$ does not reduce the $\Sigma[RO]/[Al_2O_3]$ ratio below 1.0. If the ratio goes too low, meltability is compromised, i.e., the melting temperature becomes too high. $B_2O_3$ can be used to bring the melting temperature down, but high levels of $B_2O_3$ compromise annealing point.

In addition to meltability and annealing point considerations, for AMLCD applications, the CTE of the glass should be compatible with that of silicon. To achieve such CTE values, the glasses of the invention control the $\Sigma[RO]$ content of the glass. For a given $Al_2O_3$ content, controlling the $\Sigma[RO]$ content corresponds to controlling the $\Sigma[RO]/Al_2O_3$ ratio. In practice, $\Sigma[RO]/Al_2O_3$ ratios below 1.2 can facilitate achieving a desired CTE value.

In addition to the above components, the glass compositions described herein can include various other oxides to adjust various physical, melting, fining, and forming attributes of the glasses. Examples of such other oxides include, but are not limited to, $TiO_2$, $MnO$, $Fe_2O_3$, $ZnO$, $Nb_2O_5$, $MoO_3$, $Ta_2O_5$, $WO_3$, $Y_2O_3$, $La_2O_3$ and $CeO_2$. In one aspect, the amount of each of these oxides can be less than or equal to 2.0 mole percent, and their total combined concentration can be less than or equal to 4.0 mole percent. The glass compositions described herein can also include various contaminants associated with batch materials and/or introduced into the glass by the melting, fining, and/or forming equipment used to produce the glass, particularly $Fe_2O_2$ and $ZrO_2$. The glasses can also contain $SnO_2$ either as a result of Joule melting using tin-oxide electrodes and/or through the batching of tin containing materials, e.g., $SnO_2$, $SnO$, $SnCO_3$, $SnC_2O_2$, etc.

In addition to the elements deliberately incorporated into the inventive glasses, nearly all stable elements in the periodic table are present in glasses at some level, either through low levels of contamination in the raw materials, through high-temperature erosion of refractories and precious metals in the manufacturing process, or through deliberate introduction at low levels to fine tune the attributes of the final glass. For example, zirconium may be introduced as a contaminant via interaction with zirconium-rich refractories. As a further example, platinum and rhodium may be introduced via interactions with precious metals. As a further example, iron may be introduced as a tramp in raw materials, or deliberately added to enhance control of gaseous inclusions. As a further example, manganese may be introduced to control color or to enhance control of gaseous inclusions.

Hydrogen is inevitably present in the form of the hydroxyl anion, $OH^-$, and its presence can be ascertained via standard infrared spectroscopy techniques. Dissolved hydroxyl ions significantly and nonlinearly impact the annealing point of the inventive glasses, and thus to obtain the desired annealing point it may be necessary to adjust the concentrations of major oxide components so as to compensate. Hydroxyl ion concentration can be controlled to some extent through choice of raw materials or choice of melting system. For example, boric acid is a major source of hydroxyls, and replacing boric acid with boric oxide can be a useful means to control hydroxyl concentration in the final glass. The same reasoning applies to other potential raw materials comprising hydroxyl ions, hydrates, or compounds comprising physisorbed or chemisorbed water molecules. If burners are used in the melting process, then hydroxyl ions can also be introduced through the combustion products from combustion of natural gas and related hydrocarbons, and thus it may be desirable to shift the energy used in melting from burners to electrodes to compensate. Alternatively, one might instead employ an iterative process of adjusting major oxide components so as to compensate for the deleterious impact of dissolved hydroxyl ions.

Sulfur is often present in natural gas, and likewise is a tramp component in many carbonate, nitrate, halide, and oxide raw materials. In the form of $SO_2$, sulfur can be a troublesome source of gaseous inclusions. The tendency to form $SO_2$-rich defects can be managed to a significant degree by controlling sulfur levels in the raw materials, and by incorporating low levels of comparatively reduced multivalent cations into the glass matrix (see below). While not wishing to be bound by theory, it appears that $SO_2$-rich gaseous inclusions arise primarily through reduction of sulfate ($SO_4^=$) dissolved in the glass. Deliberately controlling sulfur levels in raw materials to a low level is a useful means of reducing dissolved sulfur (presumably as sulfate) in the glass. In particular, sulfur is preferably less than 200 ppm by weight in the batch materials, and more preferably less than 100 ppm by weight in the batch materials.

Reduced multivalents can be used to control the tendency of the inventive glasses to form $SO_2$ blisters. While not wishing to be bound to theory, these elements behave as potential electron donors that suppress the electromotive force for sulfate reduction. Sulfate reduction can be written in terms of a half reaction such as $$SO_4^= \rightarrow SO_2 + O_2 + 2e^-$$

where $e^-$ denotes an electron. The "equilibrium constant" for the half reaction is $$K_{eq} = [SO_2][O_2][e^-]^2/[SO_4^=]$$

where the brackets denote chemical activities. Ideally one would like to force the reaction so as to create sulfate from $SO_2$, $O_2$ and $2e^-$. Adding nitrates, peroxides, or other oxygen-rich raw materials may help, but also may work against sulfate reduction in the early stages of melting, which may counteract the benefits of adding them in the first place. $SO_2$ has very low solubility in most glasses, and so is impractical to add to the glass melting process. Electrons may be "added" through reduced multivalents. For example, an appropriate electron-donating half reaction for ferrous iron ($Fe^{2+}$) is expressed as $$2Fe^{2+} \rightarrow 2Fe^{3+} + 2e-$$

This "activity" of electrons can force the sulfate reduction reaction to the left, stabilizing $SO_4^=$ in the glass. Suitable reduced multivalents include, but are not limited to, $Fe^{2+}$, $Mn^{2+}$, $Sb^{3+}$, $As^{3+}$, $V^{3+}$, $Ti^{3+}$, and others familiar to those skilled in the art. In each case, it may be important to minimize the concentrations of such components so as to avoid a deleterious impact on color of the glass, or in the case of As and Sb, to avoid adding such components at a high enough level so as to complicate waste management in an end-user's process.

In addition to the major oxides components of the inventive glasses, and the minor or tramp constituents noted above, halides may be present at various levels, either as contaminants introduced through the choice of raw materials, or as deliberate components used to eliminate gaseous inclusions in the glass. As a fining agent, halides may be incorporated at a level of about 0.4 mol % or less, though it is generally desirable to use lower amounts if possible to avoid corrosion of off-gas handling equipment. In an embodiment, the concentration of individual halide elements is below about 200 ppm by weight for each individual halide, or below about 800 ppm by weight for the sum of all halide elements.

In addition to these major oxide components, minor and tramp components, multivalents, and halide fining agents, it may be useful to incorporate low concentrations of other colorless oxide components to achieve desired physical, optical or viscoelastic properties. In addition to those mentioned above, such additional oxides include, but are not limited to, $HfO_2$, $In_2O_3$, $Ga_2O_3$, $Bi_2O_3$, $GeO_2$, $PbO$, $SeO_3$, $TeO_2$, $Gd_2O_3$, and others known to those skilled in the art. Through an iterative process of adjusting the relative proportions of the major oxide components of the inventive glasses, such colorless oxides can be added to a level of up to about 2 mol %.

Raw materials appropriate for producing the inventive glasses disclosed herein include commercially available sands as sources for $SiO_2$; alumina, aluminum hydroxide, hydrated forms of alumina, and various aluminosilicates, nitrates and halides as sources for $Al_2O_3$; boric acid, anhydrous boric acid and boric oxide as sources for $B_2O_3$; periclase, dolomite (also a source of CaO), magnesia, magnesium carbonate, magnesium hydroxide, and various forms of magnesium silicates, aluminosilicates, nitrates and halides as sources for MgO; limestone, aragonite, dolomite (also a source of MgO), wolastonite, and various forms of calcium silicates, aluminosilicates, nitrates and halides as sources for CaO; and oxides, carbonates, nitrates and halides of strontium and barium. If tin is used as a chemical fining agent, it can be added as $SnO_2$, as a mixed oxide with another major glass component (e.g., $CaSnO_3$), or in oxidizing conditions as SnO, tin oxalate, tin halide, or other compounds of tin known to those skilled in the art.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art. Each of the numerical values for the components of the glasses listed in Table 1 below can be used as an upper or lower limit in amending the claims without regard to the numerical values for the other components of the particular glass that had that numerical value.

Efforts have been made to ensure accuracy with respect to numbers (e.g., amounts, temperature, etc.) but some errors and deviations should be accounted for. Unless indicated otherwise, temperature is in ° C. or is at ambient temperature, and pressure is at or near atmospheric. The compositions themselves are given in mole percent on an oxide basis and have been normalized to 100%. There are numerous variations and combinations of reaction conditions, e.g., component concentrations, temperatures, pressures and other reaction ranges and conditions that can be used to optimize the product purity and yield obtained from the described process. Only reasonable and routine experimentation will be required to optimize such process conditions.

The glass properties set forth in Table 1 were determined in accordance with techniques conventional in the glass art. Thus, the linear coefficient of thermal expansion (CTE) over the temperature range 22-300° C. is expressed in terms of x $10^{-7}$/° C. and the strain and annealing points are expressed in terms of ° C. These were determined from fiber elongation techniques (ASTM references E228-85 and C336, respectively). The density in terms of grams/cm$^3$ was measured via the Archimedes method (ASTM C693). Young's modulus values in terms of GPa were determined using a resonant ultrasonic spectroscopy technique of the general type set forth in ASTM E1875-00e1.

The liquidus temperature of the glass in terms of ° C. was measured using the standard gradient boat liquidus method of ASTM C829-81. This involves placing crushed glass particles in a platinum boat, placing the boat in a furnace having a region of gradient temperatures, heating the boat in an appropriate temperature region for 72 hours, and determining by means of microscopic examination the highest temperature at which crystals appear in the interior of the glass. More particularly, the glass sample is removed from the Pt boat in one piece, and examined using polarized light microscopy to identify the location and nature of crystals which have formed against the Pt and air interfaces, and in the interior of the sample. Because the gradient of the furnace is very well known, temperature vs location can be well estimated, within 5-10° C. The temperature at which crystals are observed in the internal portion of the sample is taken to represent the liquidus of the glass (for the corresponding test period).

The melting temperature in terms of ° C. (defined as the temperature at which the glass melt demonstrates a viscosity of 200 poises) and the $10^4$ poise temperature in ° C. were calculated employing a Fulcher equation fit to high temperature viscosity data measured via rotating cylinders viscometry (ASTM C965-81). Specifically, the equation used was:

$$\log(\eta) = A + B/(T-T_0)$$

in which T is temperature and A, B and $T_o$ are fitting parameters.

The exemplary glasses of Table 1 were prepared using a commercial sand as a silica source, milled such that 90% by weight passed through a standard U.S. 100 mesh sieve. Alumina was the alumina source, periclase was the source for MgO, limestone the source for CaO, strontium carbonate, strontium nitrate or a mix thereof was the source for SrO, barium carbonate was the source for BaO, and tin (IV) oxide was the source for $SnO_2$. The raw materials were thoroughly mixed, loaded into a platinum vessel suspended in a furnace heated by silicon carbide glow-bars, melted and stirred for several hours at temperatures between 1600 and 1650° C. to ensure homogeneity, and delivered through an orifice at the base of the platinum vessel. The resulting patties of glass were annealed at or near the annealing point, and then subjected to various experimental methods to determine physical, viscous and liquidus attributes. These methods are not unique, and the glasses of Table 1 can be prepared using standard methods well-known to those skilled in the art. Such methods include a continuous melting process wherein the melter is heated by gas, by electric power, or combinations thereof.

The glasses in Table 1 contain $SnO_2$ as a fining agent, but other chemical fining agents could also be employed to obtain glass of sufficient quality for TFT substrate applications. For example, as discussed above, the inventive glasses could employ any one or combinations of $As_2O_3$, $Sb_2O_3$, $CeO_2$, $Fe_2O_3$, and halides as deliberate additions to facilitate fining, and any of these could be used in conjunction with the $SnO_2$ chemical fining agent shown in the examples.

TABLE 1

| mol % | 1 | 2 | 3 | 4 | 5 |
|---|---|---|---|---|---|
| $SiO_2$ | 66.45 | 67.06 | 66.79 | 67.2 | 67.09 |
| $Al_2O_3$ | 12.4 | 12.52 | 12.33 | 12.52 | 12.35 |
| $B_2O_3$ | 5.44 | 5.35 | 5.42 | 5.2 | 5.51 |
| MgO | 5.5 | 5.35 | 5.28 | 4.72 | 5.01 |
| CaO | 6.04 | 5.88 | 6.08 | 6.19 | 6.42 |
| SrO | 4 | 3.69 | 3.96 | 4.01 | 3.5 |
| BaO | 0.05 | 0.03 | 0.03 | 0.03 | 0.02 |
| $SnO_2$ | 0.07 | 0.09 | 0.06 | 0.09 | 0.07 |
| $Fe_2O_3$ | 0.02 | 0.02 | 0.02 | 0.02 | 0.02 |
| $ZrO_2$ | 0.02 | 0.01 | 0.03 | 0.01 | 0.02 |
| $RO/Al_2O_3$ | 1.26 | 1.19 | 1.24 | 1.19 | 1.21 |
| $SiO_2 + Al_2O_3$ | 78.9 | 79.6 | 79.1 | 79.7 | 79.4 |
| strain point | 708 | 706 | 707 | 708 | 699 |
| annealing point | 753 | 759 | 753 | 760 | 752 |
| softening point | 981 | 986 | 983 | 992 | 982 |
| CTE (RT − 300) × $10^{-7}$/° C. | 35.7 | 34.6 | 35.3 | 35.2 | 35.1 |
| density (g/cc) | 2.52 | 2.51 | 2.52 | 2.52 | 2.51 |
| Young's mod (GPa) | 81.4 | 81.1 | | 81.1 | 81 |
| T(200 p) | 1588 | 1588 | 1600 | 1601 | 1589 |
| T(10 kp) | 1288 | 1294 | 1291 | 1304 | 1291 |
| Tliq (72 h gradient boat) | 1170 | 1180 | 1180 | 1180 | 1180 |
| T(10 kp) − Tliq | 118 | 114 | 111 | 124 | 111 |

TABLE 1-continued

| mol % | 6 | 7 | 8 | 9 | 10 |
|---|---|---|---|---|---|
| $SiO_2$ | 66.47 | 67.17 | 66.37 | 67.3 | 66.54 |
| $Al_2O_3$ | 12.42 | 12.52 | 12.52 | 12.12 | 12.63 |
| $B_2O_3$ | 5.44 | 5.26 | 5.43 | 6.34 | 5.47 |
| MgO | 5.04 | 4.53 | 5.05 | 3.62 | 4.94 |
| CaO | 6.84 | 6.17 | 7.28 | 6.83 | 7.83 |
| SrO | 3.65 | 4.2 | 3.2 | 3.66 | 2.46 |
| BaO | 0.03 | 0.03 | 0.03 | 0.03 | 0.02 |
| $SnO_2$ | 0.07 | 0.09 | 0.07 | 0.09 | 0.07 |
| $Fe_2O_3$ | 0.02 | 0.02 | 0.02 | 0.01 | 0.02 |
| $ZrO_2$ | 0.02 | 0.01 | 0.03 | 0 | 0.02 |
| $RO/Al_2O_3$ | 1.25 | 1.19 | 1.24 | 1.17 | 1.21 |
| $SiO_2 + Al_2O_3$ | 78.9 | 79.7 | 78.9 | 79.4 | 79.2 |
| strain point | 708 | 707 | 707 | 699 | 703 |
| annealing point | 753 | 758 | 752 | 751 | 755 |
| softening point | 978 | 991 | 982 | 988 | 986 |
| CTE (RT − 300) × $10^{-7}$/° C. | 36.1 | 35.5 | 35.6 | 34.8 | 36.2 |
| density (g/cc) | 2.52 | 2.52 | 2.51 | 2.49 | 2.5 |
| Young's mod (GPa) | | 80.8 | | 78.6 | |
| T(200 p) | 1584 | 1582 | 1578 | 1598 | 1587 |
| T(10 kp) | 1286 | 1299 | 1285 | 1301 | 1286 |
| Tliq (72 h gradient boat) | 1185 | 1180 | 1190 | 1160 | 1175 |
| T(10 kp) − Tliq | 101 | 119 | 95 | 141 | 111 |

| mol % | 11 | 12 | 13 | 14 | 15 |
|---|---|---|---|---|---|
| $SiO_2$ | 66.36 | 68.11 | 66.4 | 68.33 | 66.12 |
| $Al_2O_3$ | 12.43 | 12.72 | 12.76 | 11.68 | 12.84 |
| $B_2O_3$ | 6.76 | 4.5 | 5.59 | 6.4 | 5.43 |
| MgO | 3.98 | 4.38 | 4.61 | 2.6 | 6.94 |
| CaO | 6.55 | 6.44 | 7.45 | 6.94 | 6.02 |
| SrO | 3.79 | 3.7 | 3.04 | 3.91 | 2.51 |
| BaO | 0.03 | 0.02 | 0.03 | 0.03 | 0.03 |
| $SnO_2$ | 0.09 | 0.09 | 0.07 | 0.09 | 0.08 |
| $Fe_2O_3$ | 0.01 | 0.01 | 0.02 | 0.01 | 0.02 |
| $ZrO_2$ | 0 | 0.03 | 0.02 | 0 | 0.03 |
| $RO/Al_2O_3$ | 1.15 | 1.14 | 1.19 | 1.15 | 1.21 |
| $SiO_2 + Al_2O_3$ | 78.8 | 80.8 | 79.2 | 80 | 79 |
| strain point | 690 | 720 | 705 | 697 | 702 |
| annealing point | 743 | 771 | 757 | 750 | 755 |
| softening point | 978 | 1006 | 987 | 992 | 978 |
| CTE (RT − 300) × $10^{-7}$/° C. | 35.4 | 34.7 | 35.6 | 35.5 | 34.1 |
| density (g/cc) | 2.496 | 2.52 | 2.51 | 2.49 | 2.5 |
| Young's mod (GPa) | 79.3 | 81.8 | | 77.4 | 82.9 |
| T(200 p) | 1586 | 1613 | 1595 | 1614 | 1575 |
| T(10 kp) | 1293 | 1311 | 1291 | 1311 | 1282 |
| Tliq (72 h gradient boat) | 1140 | 1185 | 1200 | 1155 | 1210 |
| T(10 kp) − Tliq | 153 | 126 | 91 | 156 | 72 |

| mol % | 16 | 17 | 18 | 19 | 20 |
|---|---|---|---|---|---|
| $SiO_2$ | 66.95 | 67.21 | 67.22 | 68.03 | 66.81 |
| $Al_2O_3$ | 12.43 | 12.53 | 12.49 | 12.23 | 12.63 |
| $B_2O_3$ | 5.44 | 5.26 | 5.27 | 5.16 | 5.47 |
| MgO | 4.32 | 4.96 | 4.4 | 4.19 | 5.52 |
| CaO | 7 | 6.69 | 6.77 | 6.32 | 5.65 |
| SrO | 3.73 | 3.2 | 3.69 | 3.92 | 3.77 |
| BaO | 0.03 | 0.03 | 0.03 | 0.03 | 0.04 |
| $SnO_2$ | 0.07 | 0.09 | 0.09 | 0.09 | 0.07 |
| $Fe_2O_3$ | 0.02 | 0.02 | 0.02 | 0.02 | 0.02 |
| $ZrO_2$ | 0 | 0.01 | 0.02 | 0.02 | 0.02 |
| $RO/Al_2O_3$ | 1.21 | 1.19 | 1.19 | 1.18 | 1.19 |
| $SiO_2 + Al_2O_3$ | 79.4 | 79.7 | 79.7 | 80.3 | 79.4 |
| strain point | 699 | 702 | 709 | 709 | 705 |
| annealing point | 752 | 756 | 760 | 762 | 757 |
| softening point | 984 | 989 | 992 | 993 | 985 |
| CTE (RT − 300) × $10^{-7}$/° C. | 36.4 | 34.8 | 35.6 | 35.5 | 34 |
| density (g/cc) | 2.51 | 2.51 | 2.52 | 2.51 | 2.51 |
| Young's mod (GPa) | | 82.1 | 80.9 | 80.7 | |
| T(200 p) | 1595 | 1589 | 1590 | 1599 | 1597 |
| T(10 kp) | 1293 | 1297 | 1302 | 1310 | 1294 |

TABLE 1-continued

| | | | | | |
|---|---|---|---|---|---|
| Tliq (72 h gradient boat) | 1165 | 1175 | 1185 | 1180 | 1175 |
| T(10 kp) − Tliq | 128 | 122 | 117 | 130 | 119 |

| mol % | 21 | 22 | 23 | 24 | 25 |
|---|---|---|---|---|---|
| $SiO_2$ | 67.81 | 65.85 | 69.27 | 66.5 | 66.77 |
| $Al_2O_3$ | 11.94 | 12.56 | 11.95 | 12.47 | 12.34 |
| $B_2O_3$ | 6.34 | 5.13 | 3.96 | 5.37 | 5.38 |
| MgO | 3.14 | 6.63 | 3.43 | 6.4 | 5.09 |
| CaO | 6.89 | 6.21 | 7.4 | 6.5 | 7.47 |
| SrO | 3.75 | 3.49 | 3.83 | 2.65 | 2.81 |
| BaO | 0.03 | 0.02 | 0.03 | 0.03 | 0.03 |
| $SnO_2$ | 0.09 | 0.07 | 0.11 | 0.07 | 0.07 |
| $Fe_2O_3$ | 0.01 | 0.02 | 0.02 | 0.02 | 0.02 |
| $ZrO_2$ | 0 | 0.02 | 0 | 0 | 0.02 |
| $RO/Al_2O_3$ | 1.16 | 1.3 | 1.23 | 1.25 | 1.25 |
| $SiO_2 + Al_2O_3$ | 79.8 | 78.4 | 81.2 | 79 | 79.1 |
| strain point | 699 | 703 | 719 | 704 | 704 |
| annealing point | 751 | 754 | 771 | 755 | 755 |
| softening point | 988 | 976 | 1011 | 982 | 986 |
| CTE (RT − 300) × $10^{-7}$/° C. | 35.2 | 35.3 | 35.9 | 34.8 | 36.1 |
| density (g/cc) | 2.49 | 2.52 | 2.52 | 2.5 | 2.5 |
| Young's mod (GPa) | 78.4 | 83 | 81.2 | 82.1 | |
| T(200 p) | 1606 | 1573 | 1639 | 1586 | 1596 |
| T(10 kp) | 1307 | 1277 | 1329 | 1284 | 1292 |
| Tliq (72 h gradient boat) | 1150 | 1195 | 1220 | 1185 | 1180 |
| T(10 kp) − Tliq | 157 | 82 | 109 | 99 | 112 |

| mol % | 26 | 27 | 28 | 29 | 30 |
|---|---|---|---|---|---|
| $SiO_2$ | 67.31 | 67.17 | 67.62 | 66.83 | 66.41 |
| $Al_2O_3$ | 12.57 | 12.5 | 11.87 | 12.26 | 12.44 |
| $B_2O_3$ | 5.49 | 5.21 | 6.61 | 5.41 | 5.46 |
| MgO | 4.36 | 4.46 | 2.57 | 5.09 | 5.28 |
| CaO | 6.43 | 6.97 | 6.86 | 7.25 | 7.04 |
| SrO | 3.68 | 3.53 | 4.32 | 3.03 | 3.23 |
| BaO | 0.02 | 0.03 | 0.04 | 0.03 | 0.03 |
| $SnO_2$ | 0.09 | 0.09 | 0.1 | 0.07 | 0.07 |
| $Fe_2O_3$ | 0.01 | 0.02 | 0.01 | 0.02 | 0.02 |
| $ZrO_2$ | 0.03 | 0.01 | 0 | 0.02 | 0.03 |
| $RO/Al_2O_3$ | 1.15 | 1.2 | 1.16 | 1.26 | 1.25 |
| $SiO_2 + Al_2O_3$ | 79.9 | 79.7 | 79.5 | 79.1 | 78.9 |
| strain point | 710 | 707 | 691 | 700 | 700 |
| annealing point | 762 | 760 | 745 | 753 | 753 |
| softening point | 992 | 990 | 985 | 982 | 983 |
| CTE (RT − 300) × $10^{-7}$/° C. | 34.9 | 34.6 | 35.5 | 35.5 | 36 |
| density (g/cc) | 2.51 | 2.51 | 2.497 | 2.51 | 2.51 |
| Young's mod (GPa) | 81.2 | 81.1 | 77.6 | | |
| T(200 p) | 1599 | 1594 | 1606 | 1592 | 1589 |
| T(10 kp) | 1299 | 1302 | 1304 | 1291 | 1289 |
| Tliq (72 h gradient boat) | 1170 | 1180 | 1145 | 1175 | 1165 |
| T(10 kp) − Tliq | 129 | 122 | 159 | 116 | 124 |

| mol % | 31 | 32 | 33 | 34 | 35 |
|---|---|---|---|---|---|
| $SiO_2$ | 68.29 | 68 | 66.7 | 66.41 | 68.49 |
| $Al_2O_3$ | 12.78 | 11.7 | 12.63 | 12.44 | 11.65 |
| $B_2O_3$ | 4.08 | 6.65 | 5.43 | 5.47 | 6.15 |
| MgO | 4.46 | 2.09 | 4.73 | 6.65 | 2.24 |
| CaO | 6.5 | 6.96 | 7.4 | 5.8 | 7.16 |
| SrO | 3.73 | 4.45 | 2.97 | 3.09 | 4.18 |
| BaO | 0.02 | 0.04 | 0.03 | 0.03 | 0.03 |
| $SnO_2$ | 0.09 | 0.1 | 0.07 | 0.07 | 0.09 |
| $Fe_2O_3$ | 0.01 | 0.01 | 0.02 | 0.02 | 0.01 |
| $ZrO_2$ | 0.03 | 0 | 0.02 | 0.03 | 0 |
| $RO/Al_2O_3$ | 1.15 | 1.16 | 1.2 | 1.25 | 1.17 |
| $SiO_2 + Al_2O_3$ | 81.1 | 79.7 | 79.3 | 78.9 | 80.1 |
| strain point | 725 | 691 | 705 | 711 | 699 |
| annealing point | 777 | 745 | 757 | 756 | 752 |
| softening point | 1009 | 987 | 986 | 978 | 992 |
| CTE (RT − 300) × $10^{-7}$/° C. | 35.4 | 35.3 | 35.8 | 34.6 | 34.5 |
| density (g/cc) | 2.52 | 2.493 | 2.5 | 2.51 | 2.49 |
| Young's mod (GPa) | 81.4 | 77.7 | | | 77.5 |
| T(200 p) | 1617 | 1621 | 1595 | 1581 | 1629 |
| T(10 kp) | 1318 | 1315 | 1293 | 1284 | 1321 |
| Tliq (72 h gradient boat) | 1195 | 1135 | 1190 | 1170 | 1175 |
| T(10 kp) − Tliq | 123 | 180 | 103 | 114 | 146 |

| mol % | 36 | 37 | 38 | 39 | 40 |
|---|---|---|---|---|---|
| $SiO_2$ | 66.93 | 66.45 | 67.41 | 66.88 | 67.29 |
| $Al_2O_3$ | 12.34 | 12.61 | 12.53 | 12.9 | 12.51 |
| $B_2O_3$ | 6.36 | 5.42 | 5.05 | 5.45 | 5.23 |
| MgO | 4.09 | 4.86 | 4.85 | 4.16 | 4.44 |
| CaO | 6.69 | 7.46 | 6.15 | 7.35 | 6.57 |
| SrO | 3.47 | 3.05 | 3.87 | 3.15 | 3.82 |
| BaO | 0.03 | 0.03 | 0.03 | 0 | 0.03 |
| $SnO_2$ | 0.09 | 0.07 | 0.09 | 0.07 | 0.09 |
| $Fe_2O_3$ | 0.01 | 0.02 | 0.02 | 0.02 | 0.02 |
| $ZrO_2$ | 0 | 0.02 | 0.01 | 0.02 | 0.01 |
| $RO/Al_2O_3$ | 1.16 | 1.22 | 1.19 | 1.14 | 1.19 |
| $SiO_2 + Al_2O_3$ | 79.3 | 79.1 | 79.9 | 79.8 | 79.8 |
| strain point | 698 | 702 | 707 | 702 | 707 |
| annealing point | 750 | 754 | 759 | 756 | 759 |
| softening point | 982 | 984 | 990 | 989 | 990 |
| CTE (RT − 300) × $10^{-7}$/° C. | 35 | 35.2 | 34.6 | 34.2 | 35.8 |
| density (g/cc) | 2.49 | 2.51 | 2.52 | 2.5 | 2.52 |
| Young's mod (GPa) | 79.3 | | 81.4 | | 80.7 |
| T(200 p) | 1588 | 1595 | 1592 | 1594 | 1594 |
| T(10 kp) | 1294 | 1287 | 1296 | 1294 | 1297 |
| Tliq (72 h gradient boat) | 1150 | 1185 | 1170 | 1215 | 1175 |
| T(10 kp) − Tliq | 144 | 102 | 126 | 79 | 122 |

| mol % | 41 | 42 | 43 | 44 | 45 |
|---|---|---|---|---|---|
| $SiO_2$ | 66.24 | 66.74 | 67.29 | 66.58 | 66.23 |
| $Al_2O_3$ | 12.43 | 12.51 | 12.56 | 12.6 | 12.64 |
| $B_2O_3$ | 5.61 | 6.26 | 5.68 | 5.47 | 5.57 |
| MgO | 5.02 | 4.54 | 4.3 | 5.6 | 4.91 |
| CaO | 6.88 | 6.55 | 6.36 | 6 | 7.45 |
| SrO | 3.65 | 3.26 | 3.65 | 3.62 | 3.06 |
| BaO | 0.04 | 0.03 | 0.02 | 0.04 | 0.03 |
| $SnO_2$ | 0.07 | 0.09 | 0.09 | 0.07 | 0.07 |
| $Fe_2O_3$ | 0.02 | 0.01 | 0.02 | 0.02 | 0.02 |
| $ZrO_2$ | 0.03 | 0 | 0.02 | 0 | 0.02 |
| $RO/Al_2O_3$ | 1.25 | 1.15 | 1.14 | 1.21 | 1.22 |
| $SiO_2 + Al_2O_3$ | 78.7 | 79.3 | 79.9 | 79.2 | 78.9 |
| strain point | 705 | 695 | 706 | 706 | 704 |
| annealing point | 751 | 747 | 759 | 757 | 755 |
| softening point | 978 | 979 | 988 | 987 | 985 |
| CTE (RT − 300) × $10^{-7}$/° C. | 36.1 | 34.6 | 34.7 | 35.7 | 36.1 |
| density (g/cc) | 2.52 | 2.49 | 2.51 | 2.51 | 2.51 |
| Young's mod (GPa) | 81.6 | 79.6 | 80.4 | | |
| T(200 p) | 1582 | 1586 | 1599 | 1599 | 1593 |
| T(10 kp) | 1284 | 1293 | 1304 | 1291 | 1286 |
| Tliq (72 h gradient boat) | 1185 | 1145 | 1170 | 1170 | 1180 |
| T(10 kp) − Tliq | 99 | 148 | 134 | 121 | 106 |

| mol % | 46 | 47 | 48 | 49 | 50 |
|---|---|---|---|---|---|
| $SiO_2$ | 67.24 | 66.83 | 66.82 | 66.54 | 66.51 |
| $Al_2O_3$ | 12.46 | 12.28 | 12.69 | 12.57 | 12.38 |
| $B_2O_3$ | 5.25 | 5.41 | 5.55 | 5.51 | 5.44 |
| MgO | 4.65 | 5.13 | 4.83 | 5.53 | 5.52 |
| CaO | 6.94 | 6.07 | 8.12 | 6.88 | 7.1 |
| SrO | 3.31 | 4.17 | 1.86 | 2.82 | 2.91 |
| BaO | 0.02 | 0 | 0.02 | 0.03 | 0.03 |
| $SnO_2$ | 0.09 | 0.07 | 0.07 | 0.07 | 0.07 |
| $Fe_2O_3$ | 0.02 | 0.02 | 0.02 | 0.02 | 0.02 |
| $ZrO_2$ | 0.02 | 0.02 | 0.02 | 0.02 | 0.02 |
| $RO/Al_2O_3$ | 1.2 | 1.25 | 1.17 | 1.21 | 1.26 |
| $SiO_2 + Al_2O_3$ | 79.7 | 79.1 | 79.5 | 79.1 | 78.9 |
| strain point | 707 | 712 | 705 | 703 | 701 |
| annealing point | 759 | 756 | 758 | 755 | 753 |
| softening point | 989 | 983 | 988 | 983 | 979 |
| CTE (RT − 300) × $10^{-7}$/° C. | 35.4 | 36.2 | 34.7 | 34.8 | 32.4 |
| density (g/cc) | 2.51 | 2.52 | 2.47 | 2.5 | 2.5 |
| Young's mod (GPa) | 81.6 | | | | |

TABLE 1-continued

| | | | | | |
|---|---|---|---|---|---|
| T(200 p) | 1589 | 1594 | 1593 | 1590 | 1585 |
| T(10 kp) | 1296 | 1290 | 1292 | 1286 | 1283 |
| Tliq (72 h gradient boat) | 1190 | 1175 | 1180 | 1170 | 1170 |
| T(10 kp) − Tliq | 106 | 115 | 112 | 116 | 113 |

| mol % | 51 | 52 | 53 | 54 | 55 |
|---|---|---|---|---|---|
| $SiO_2$ | 65.7 | 69.03 | 66.44 | 67.32 | 66.83 |
| $Al_2O_3$ | 12.44 | 12.02 | 12.4 | 12.52 | 12.32 |
| $B_2O_3$ | 5.5 | 4.78 | 5.57 | 5.19 | 6.72 |
| MgO | 7.26 | 4.52 | 5.12 | 5.22 | 3.48 |
| CaO | 6.31 | 5.6 | 7.48 | 6.14 | 6.58 |
| SrO | 2.65 | 3.87 | 2.85 | 3.46 | 3.92 |
| BaO | 0.03 | 0.02 | 0.03 | 0.03 | 0.03 |
| $SnO_2$ | 0.08 | 0.14 | 0.07 | 0.09 | 0.1 |
| $Fe_2O_3$ | 0.02 | 0.01 | 0.02 | 0.02 | 0.01 |
| $ZrO_2$ | 0.03 | 0 | 0.02 | 0.01 | 0 |
| $RO/Al_2O_3$ | 1.31 | 1.17 | 1.25 | 1.19 | 1.14 |
| $SiO_2 + Al_2O_3$ | 78.1 | 81.1 | 78.8 | 79.8 | 79.2 |
| strain point | 697 | 711 | 704 | 708 | 694 |
| annealing point | 748 | 765 | 755 | 760 | 746 |
| softening point | 974 | 1007 | 985 | 991 | 981 |
| CTE (RT − 300) × $10^{-7}$/° C. | 34.8 | 34 | 35.7 | 35.1 | 34.8 |
| density (g/cc) | 2.51 | 2.5 | 2.5 | 2.51 | 2.495 |
| Young's mod (GPa) | 83.5 | 80.8 | | 81.6 | 78.4 |
| T(200 p) | 1570 | 1637 | 1592 | 1593 | 1595 |
| T(10 kp) | 1277 | 1323 | 1289 | 1299 | 1296 |
| Tliq (72 h gradient boat) | 1180 | 1220 | 1180 | 1165 | 1130 |
| T(10 kp) − Tliq | 97 | 103 | 109 | 134 | 166 |

| mol % | 56 | 57 | 58 | 59 | 60 |
|---|---|---|---|---|---|
| $SiO_2$ | 69.32 | 66.74 | 66.73 | 67.15 | 66.45 |
| $Al_2O_3$ | 11.84 | 12.48 | 12.54 | 12.56 | 12.43 |
| $B_2O_3$ | 4.22 | 5.05 | 5.3 | 5.31 | 5.44 |
| MgO | 3.34 | 5.07 | 4.9 | 4.62 | 5.5 |
| CaO | 7.31 | 6.26 | 7.53 | 6.49 | 6.6 |
| SrO | 3.82 | 4.28 | 2.87 | 3.71 | 3.43 |
| BaO | 0.03 | 0.03 | 0.03 | 0.02 | 0.03 |
| $SnO_2$ | 0.11 | 0.07 | 0.07 | 0.09 | 0.07 |
| $Fe_2O_3$ | 0.02 | 0.02 | 0.02 | 0.02 | 0.02 |
| $ZrO_2$ | 0 | 0 | 0.03 | 0.02 | 0.03 |
| $RO/Al_2O_3$ | 1.22 | 1.25 | 1.22 | 1.18 | 1.25 |
| $SiO_2 + Al_2O_3$ | 81.2 | 79.2 | 79.3 | 79.7 | 78.9 |
| strain point | 719 | 710 | 704 | 704 | 710 |
| annealing point | 771 | 756 | 756 | 758 | 754 |
| softening point | 1009 | 984 | 984 | 988 | 983 |
| CTE (RT − 300) × $10^{-7}$/° C. | 35.8 | 36.6 | 36.2 | 35.7 | 35.9 |
| density (g/cc) | 2.51 | 2.53 | 2.51 | 2.51 | 2.51 |
| Young's mod (GPa) | 81 | | | 81.1 | |
| T(200 p) | 1647 | 1595 | 1587 | 1596 | 1582 |
| T(10 kp) | 1327 | 1292 | 1287 | 1299 | 1284 |
| Tliq (72 h gradient boat) | 1220 | 1200 | 1175 | 1160 | 1165 |
| T(10 kp) − Tliq | 107 | 92 | 112 | 139 | 119 |

| mol % | 61 | 62 | 63 | 64 | 65 |
|---|---|---|---|---|---|
| $SiO_2$ | 67.09 | 66.91 | 67.13 | 66.54 | 67.66 |
| $Al_2O_3$ | 12.09 | 12.59 | 12.49 | 12.4 | 12.7 |
| $B_2O_3$ | 6.72 | 5.44 | 5.48 | 5.4 | 5 |
| MgO | 3.05 | 4.63 | 5.37 | 6.77 | 4.42 |
| CaO | 6.76 | 7.3 | 6.64 | 5.21 | 6.38 |
| SrO | 4.14 | 2.99 | 2.73 | 3.54 | 3.67 |
| BaO | 0.04 | 0.03 | 0.03 | 0.03 | 0.03 |
| $SnO_2$ | 0.1 | 0.07 | 0.07 | 0.07 | 0.1 |
| $Fe_2O_3$ | 0.01 | 0.02 | 0.02 | 0.02 | 0.01 |
| $ZrO_2$ | 0 | 0.03 | 0.03 | 0.03 | 0.03 |
| $RO/Al_2O_3$ | 1.16 | 1.19 | 1.18 | 1.25 | 1.14 |
| $SiO_2 + Al_2O_3$ | 79.2 | 79.5 | 79.6 | 78.9 | 80.4 |
| strain point | 693 | 705 | 706 | 699 | 714 |
| annealing point | 746 | 757 | 758 | 751 | 766 |
| softening point | 981 | 987 | 988 | 981 | 1001 |
| CTE (RT − 300) × $10^{-7}$/° C. | 34.9 | 35.4 | 34.3 | 35.1 | 35.2 |
| density (g/cc) | 2.496 | 2.5 | 2.5 | 2.51 | 2.51 |
| Young's mod (GPa) | 78.4 | | | | 82.1 |
| T(200 p) | 1602 | 1601 | 1591 | 1586 | 1602 |
| T(10 kp) | 1306 | 1296 | 1291 | 1287 | 1304 |
| Tliq (72 h gradient boat) | 1125 | 1185 | 1170 | 1210 | 1180 |
| T(10 kp) − Tliq | 181 | 111 | 121 | 77 | 124 |

As can be seen in Table 1, the exemplary glasses have properties that make them suitable for display applications, such as AMLCD substrate applications, and more particularly for low-temperature polysilicon and oxide thin film transistor applications. Although not shown in Table 1, the glasses have durabilities in acid and base media that are similar to those achieved by commercial AMLCD substrates, and thus are appropriate for AMLCD applications. The exemplary glasses can be formed using the float process or other processes via the aforementioned criteria.

Various modifications and variations can be made to the materials, methods, and articles described herein. Other aspects of the materials, methods, and articles described herein will be apparent from consideration of the specification and practice of the materials, methods, and articles disclosed herein. It is intended that the specification and examples be considered as exemplary.

What is claimed is:

1. A substantially alkali-free glass, wherein the glass satisfies the following relationships:

$$[SiO_2]+[Al_2O_3] \leq 81.3; \qquad (a)$$

$$\Sigma[RO]/[Al_2O_3] \leq 1.3; \text{ and} \qquad (b)$$

$$a_0+a_1*[Al_2O_3]+a_2*[B_2O_3]+a_3*[MgO]+a_4*[CaO]+a_5*[SrO] \leq 1310 \qquad (c)$$

where $a_0=1710.446$, $a_1=-7.715$, $a_2=-14.847$, $a_3=-17.550$, $a_4=-16.643$, and $a_5=-12.574$;

$$84 \geq a_0+a_1*[Al_2O_3]+a_2*[B_2O_3]+a_3*[MgO]+a_4*[CaO]+a_5*[SrO] \geq 68 \qquad (f)$$

where $a_0=67.773$, $a_1=0.865$, $a_2=-0.825$, $a_3=0.903$, $a_4=0.356$, and $a_5=0.133$; and $$38 \geq a_0+a_1*[Al_2O_3]+a_2*[B_2O_3]+a_3*[MgO]+a_4*[CaO]+a_5*[SrO] \geq 30 \qquad (g)$$

where $a_0=18.773$, $a_1=-0.365$, $a_2=0.187$, $a_3=0.744$, $a_4=1.500$, and $a_5=1.848$; and wherein the glass satisfies at least one of the following relationships (d1) or (d2):

$$a_0+a_1*[Al_2O_3]+a_2*[B_2O_3]+a_3*[MgO]+a_4*[CaO]+a_5*[SrO] \geq 775 \qquad (d1)$$

where $a_0=847.516$, $a_1=4.747$, $a_2=-10.144$, $a_3=-5.089$, $a_4=-6.837$, and $a_5=-6.548$; or $$a_0+a_1*[Al_2O_3]+a_2*[B_2O_3]+a_3*[MgO]+a_4*[CaO]+a_5*[SrO] \geq 720 \qquad (d2)$$

where $a_0=774.973$, $a_1=4.886$, $a_2=-9.666$, $a_3=-3.610$, $a_4=-5.840$, and $a_5=-5.713$; and wherein $[SiO_2]$, $[Al_2O_3]$, $[B_2O_3]$, $[MgO]$, $[CaO]$, and $[SrO]$ represent mole percents of $SiO_2$, $Al_2O_3$, $B_2O_3$, MgO, CaO, and SrO, respectively, and $\Sigma[RO]$ equals the sum of mole percents of MgO, CaO, SrO, BaO, and ZnO.

2. The glass of claim 1, wherein the glass satisfies both of the following relationships (d1) and (d3):

$$a_0+a_1*[Al_2O_3]+a_2*[B_2O_3]+a_3*[MgO]+a_4*[CaO]+a_5*[SrO] \geq 775 \qquad (d1)$$

where $a_0$=847.516, $a_1$=4.747, $a_2$=−10.144, $a_3$=−5.089, $a_4$=−6.837, and $a_5$=−6.548; and $$a_0+a_1*[Al_2O_3]+a_2*[B_2O_3]+a_3*[MgO]+a_4*[CaO]+a_5*[SrO] \geq 685 \quad (d3)$$

where $a_0$=774.973, $a_1$=4.886, $a_2$=−9.666, $a_3$=−3.610, $a_4$=−5.840, and $a_5$=−5.713.

3. The glass of claim 2, wherein the strain point of the glass is greater than or equal to 685° C. when measured by a fiber elongation technique.

4. The glass of claim 1, wherein the glass satisfies both of the following relationships (d2) and (d4):

$$a_0+a_1*[Al_2O_3]+a_2*[B_2O_3]+a_3*[MgO]+a_4*[CaO]+a_5*[SrO] \geq 720 \quad (d2)$$

where $a_0$=774.973, $a_1$=4.886, $a_2$=−9.666, $a_3$=−3.610, $a_4$=−5.840, and $a_5$=−5.713; and $$a_0+a_1*[Al_2O_3]+a_2*[B_2O_3]+a_3*[MgO]+a_4*[CaO]+a_5*[SrO] \geq 740 \quad (d4)$$

where $a_0$=847.516, $a_1$=4.747, $a_2$=−10.144, $a_3$=−5.089, $a_4$=−6.837, and $a_5$=−6.548.

5. The glass of claim 4, wherein the annealing point of the glass is greater than or equal to 740° C. when measured by a fiber elongation technique.

6. The glass of claim 1, wherein the glass satisfies the following relationship (e):

$$a_0+a_1*[Al_2O_3]+a_2*[B_2O_3]+a_3*[MgO]+a_4*[CaO]+a_5*[SrO] \geq 200 \quad (e)$$

where $a_0$=387.802, $a_1$=33.509, $a_2$=52.734, $a_3$=18.704, $a_4$=−40.918, and $a_5$=−77.347.

7. The glass of claim 6, wherein the indentation crack initiation threshold of the glass is greater than or equal to 200 grams force.

8. The glass of claim 1, wherein the Young's modulus (E) of the glass satisfies the relationship:

$$84 \text{ GPa} \geq E \geq 68 \text{ GPa}.$$

9. The glass of claim 1, wherein the coefficient of thermal expansion (CTE) of the glass over the range from 22° C. to 300° C. satisfies the relationship:

$$38 \times 10^{-7}/°C. \geq CTE \geq 30 \times 10^{-7}/°C.,$$

wherein the CTE is measured by a fiber elongation technique.

10. The glass of claim 1, wherein the glass satisfies the following relationship (h):

$$a_0+a_1*[Al_2O_3]+a_2*[B_2O_3]+a_3*[MgO]+a_4*[CaO]+a_5*[SrO] \leq 2.56 \quad (h)$$

where $a_0$=2.195, $a_1$=0.009, $a_2$=−0.005, $a_3$=0.011, $a_4$=0.013, and $a_5$=0.027.

11. The glass of claim 10, wherein the density of the glass is less than or equal to 2.56 grams/cm³.

12. The glass of claim 1, wherein the glass satisfies both of the following relationships:

$$a_0+a_1*[Al_2O_3]+a_2*[B_2O_3]+a_3*[MgO]+a_4*[CaO]+a_5*[SrO] \geq 200 \quad (e)$$

where $a_0$=387.802, $a_1$=33.509, $a_2$=52.734, $a_3$=18.704, $a_4$=−40.918, and $a_5$=−77.347; and $$a_0+a_1*[Al_2O_3]+a_2*[B_2O_3]+a_3*[MgO]+a_4[CaO]+a_5*[SrO] \leq 2.56 \quad (h)$$

where $a_0$=2.195, $a_1$=0.009, $a_2$=−0.005, $a_3$=0.011, $a_4$=0.013, and $a_5$=0.027.

13. The glass of claim 1, wherein the glass has at least two of the following properties:

(i) an annealing point of the glass is greater than or equal to 740° C. when measured by a fiber elongation technique;
(ii) a glass strain point greater than or equal to 685° C. when measured by a fiber elongation technique;
(iii) an indentation crack initiation threshold of the glass is greater than or equal to 200 grams force;
(iv) a Young's modulus (E) of the glass satisfies the relationship: $84 \geq GPa \geq E$ 68 GPa;
(v) a coefficient of thermal expansion (CTE) of the glass over the range from 22° C. to 300° C. satisfies the relationship: $38 \times 10^{-7}/°C. \geq CTE \geq 30 \times 10^{-7}/°C.$, where the CTE is measured by a fiber elongation technique;
(vi) a density of the glass is less than or equal to 2.56 grams/cm³; and
(vii) a $10^4$ poise temperature ($T_{10k}$) of the glass is less than or equal to 1330° C.

14. The glass of claim 13, wherein the glass has all of properties (i)-(vii).

15. The glass of claim 1, wherein the glass comprises in mole percent on an oxide basis:
$SiO_2$: 65-70.3
$Al_2O_3$: 11-12.9
$B_2O_3$: 2-7.5
MgO: 2-7.5
CaO: 3-11
SrO: 0-5.5
BaO: 0-2
ZnO: 0-2.

16. A glass substrate comprising the glass of claim 1.

17. A display device comprising the glass substrate of claim 16.

18. A substantially alkali-free glass comprising $SiO_2$, $Al_2O_3$, $B_2O_3$, MgO, CaO, and optionally at least one oxide chosen from the group consisting of SrO, BaO, and ZnO, wherein:

$$[SiO_2]+[Al_2O_3] \leq 81.3; \quad (a)$$

$$\Sigma[RO]/[Al_2O_3] \leq 1.3; \quad (b)$$

$$a_0+a_1*[Al_2O_3]+a_2*[B_2O_3]+a_3*[MgO]+a_4*[CaO]+a_5*[SrO] \leq 1310 \quad (c)$$

where $a_0$=1710.446, $a_1$=−7.715, $a_2$=−14.847, $a_3$=−17.550, $a_4$=−16.643, and $a_5$=−12.574;

$$a_0+a_1*[Al_2O_3]+a_2*[B_2O_3]+a_3*[MgO]+a_4*[CaO]+a_5*[SrO] \geq 775 \quad (d1)$$

where $a_0$=847.516, $a_1$=4.747, $a_2$=−10.144, $a_3$=−5.089, $a_4$=−6.837, and $a_5$=−6.548;

$$84 \geq a_0+a_1*[Al_2O_3]+a_2*[B_2O_3]+a_3*[MgO]+a_4*[CaO]+a_5*[SrO] \geq 68 \quad (f)$$

where $a_0$=67.773, $a_1$=0.865, $a_2$=−0.825, $a_3$=0.903, $a_4$=0.356, and $a_5$=0.133; and $$38 \geq a_0+a_1*[Al_2O_3]+a_2*[B_2O_3]+a_3*[MgO]+a_4*[CaO]+a_5*[SrO] \geq 30 \quad (g)$$

where $a_0$=18.773, $a_1$=−0.365, $a_2$=0.187, $a_3$=0.744, $a_4$=1.500, and $a_5$=1.848; and
wherein [$SiO_2$], [$Al_2O_3$], [$B_2O_3$], [MgO], [CaO], and [SrO] are the mole percents of $SiO_2$, $Al_2O_3$, $B_2O_3$, MgO, CaO, and SrO, respectively, and $\Sigma[RO]$ equals the sum of the mole percents of MgO, CaO, SrO, BaO, and ZnO.

19. A substantially alkali-free glass comprising $SiO_2$, $Al_2O_3$, $B_2O_3$, MgO, CaO, and optionally at least one oxide chosen from the group consisting of SrO, BaO, and ZnO, wherein:

$[SiO_2]+[Al_2O_3] \leq 81.3$; (a)

$\Sigma[RO]/[Al_2O_3]$ 1.3; (b)

$a_0+a_1*[Al_2O_3]+a_2*[B_2O_3]+a_3*[MgO]+a_4[CaO]+a_5*[SrO] \leq 1310$ (c)

where $a_0=1710.446$, $a_1=-7.715$, $a_2=-14.847$, $a_3=-17.550$, $a_4=-16.643$, and $a_5=-12.574$;

$a_0+a_1*[Al_2O_3]+a_2*[B_2O_3]+a_3*[MgO]+a_4*[CaO]+a_5*[SrO] \geq 720$ (d2)

where $a_0=774.973$, $a_1=4.886$, $a_2=-9.666$, $a_3=-3.610$, $a_4=-5.840$, and $a_5=-5.713$;

$84 \geq a_0+a_1*[Al_2O_3]+a_2[B_2O_3]+a_3*[MgO]+a_4*[CaO]+a_5*[SrO] \geq 68$ (f)

where $a_0=67.773$, $a_1=0.865$, $a_2=-0.825$, $a_3=0.903$, $a_4=0.356$, and $a_5=0.133$; and $38 \geq a_0+a_1*[Al_2O_3]+a_2*[B_2O_3]+a_3*[MgO]+a_4*[CaO]+a_5*[SrO] \geq 30$ (g)

where $a_0=18.773$, $a_1=-0.365$, $a_2=0.187$, $a_3=0.744$, $a_4=1.500$, and $a_5=1.848$; and wherein $[SiO_2]$, $[Al_2O_3]$, $[B_2O_3]$, $[MgO]$, $[CaO]$, and $[SrO]$ represent mole percents of $SiO_2$, $Al_2O_3$, $B_2O_3$, MgO, CaO, and SrO, respectively, and $\Sigma[RO]$ equals the sum of the mole percents of MgO, CaO, SrO, BaO, and ZnO.

\* \* \* \* \*

UNITED STATES PATENT AND TRADEMARK OFFICE
CERTIFICATE OF CORRECTION

PATENT NO. : 9,932,262 B2
APPLICATION NO. : 14/862496
DATED : April 3, 2018
INVENTOR(S) : Adam James Ellison Page 1 of 1

It is certified that error appears in the above-identified patent and that said Letters Patent is hereby corrected as shown below:

In the Claims

Column 23, Line 2, Claim 19, delete "[Al$_2$O$_3$]1.3;" and insert -- [Al$_2$O$_3$] ≤ 1.3;" --, therefor.

Column 23, Line 4, Claim 19, delete "a$_4$[CaO]" and insert -- a$_4$*[CaO] --, therefor.

Column 23, Line 14, Claim 19, delete "a$_2$[B$_2$O$_3$]" and insert -- a$_2$*[B$_2$O$_3$]" --, therefor.

Signed and Sealed this
Twenty-fourth Day of December, 2019

Andrei Iancu
*Director of the United States Patent and Trademark Office*